United States Patent
Kobayashi

(10) Patent No.: US 8,987,978 B2
(45) Date of Patent: Mar. 24, 2015

(54) PIEZOELECTRIC VIBRATING PIECE, PIEZOELECTRIC VIBRATOR, OSCILLATOR, ELECTRONIC APPARATUS AND RADIO TIMEPIECE

(71) Applicant: SII Crystal Technology Inc., Chiba (JP)

(72) Inventor: Takashi Kobayashi, Chiba (JP)

(73) Assignee: SII Crystal Technology Inc., Chiba (JP)

(*) Notice: Subject to any disclaimer, the term of this patent is extended or adjusted under 35 U.S.C. 154(b) by 0 days.

(21) Appl. No.: 14/024,857

(22) Filed: Sep. 12, 2013

(65) Prior Publication Data
US 2014/0078870 A1 Mar. 20, 2014

(30) Foreign Application Priority Data
Sep. 18, 2012 (JP) ................................. 2012-204611

(51) Int. Cl.
| | |
|---|---|
| *H01L 41/08* | (2006.01) |
| *H03H 9/21* | (2006.01) |
| *H01L 41/09* | (2006.01) |
| *G04R 60/00* | (2013.01) |
| *H03H 9/215* | (2006.01) |
| *H03H 9/10* | (2006.01) |
| *G04R 20/10* | (2013.01) |
| *G04C 3/12* | (2006.01) |
| *H03H 3/02* | (2006.01) |

(52) U.S. Cl.
CPC ................ *H01L 41/09* (2013.01); *G04R 60/00* (2013.01); *H03H 9/215* (2013.01); *H03H 2003/026* (2013.01); *H03H 9/1021* (2013.01); *G04R 20/10* (2013.01); *G04C 3/12* (2013.01)
USPC ......................................... 310/370

(58) Field of Classification Search
CPC ... H03H 9/21; H03H 9/215; H03H 2003/026; G01C 19/56; B06B 1/0659
USPC ................ 310/370; 333/200; 331/156
See application file for complete search history.

(56) References Cited

U.S. PATENT DOCUMENTS

| 6,724,271 | B2 | 4/2004 | Sakata et al. |
| 7,112,915 | B2 | 9/2006 | Tanaya et al. |
| 7,211,936 | B2 | 5/2007 | Tanaya et al. |

(Continued)

FOREIGN PATENT DOCUMENTS

JP     2009-081520 A     4/2009

OTHER PUBLICATIONS

Office Action for U.S. Appl. No. 13/629,283 dated Sep. 30, 2014, 7 pages.

*Primary Examiner* — J. San Martin
(74) *Attorney, Agent, or Firm* — Brinks Gilson & Lione

(57) ABSTRACT

A piezoelectric vibrating piece, a piezoelectric vibrator, an oscillator, an electronic apparatus and a radio timepiece capable of reducing the size while suppressing reduction of rigidity and having excellent vibration characteristics. The piezoelectric vibrating piece includes a pair of vibrating arm portions in parallel to each other, a base portion integrally fixing base end portions of the pair of vibrating arm portions in a length direction, groove portions on main surfaces of the pair of vibrating arm portions and extending along the length direction, where each of the groove portions includes a first groove portion near a tip portion end of the vibrating arm portions and a second groove portion near the base end portion side of the vibrating arm portions with respect to the first groove portion, and the second groove portion is offset in a −X axis direction with respect to the first groove portion.

11 Claims, 13 Drawing Sheets

(56) References Cited

U.S. PATENT DOCUMENTS

| | | | |
|---|---|---|---|
| 7,253,554 B2 * | 8/2007 | Dalla Piazza et al. | 310/370 |
| 7,535,159 B2 | 5/2009 | Kizaki | |
| 7,932,664 B2 | 4/2011 | Yamazaki et al. | |
| 8,102,103 B2 * | 1/2012 | Furuhata et al. | 310/370 |
| 8,432,087 B2 | 4/2013 | Yamada et al. | |
| 2012/0195170 A1 | 8/2012 | Kobayashi | |
| 2014/0078870 A1 | 3/2014 | Kobayashi | |
| 2014/0111065 A1 | 4/2014 | Kobayashi | |

* cited by examiner

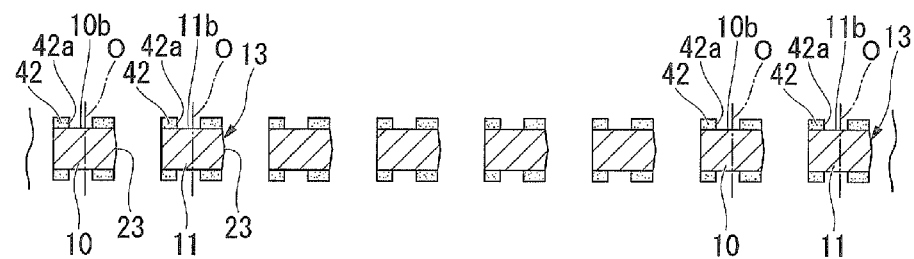
FIG.7
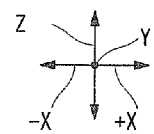
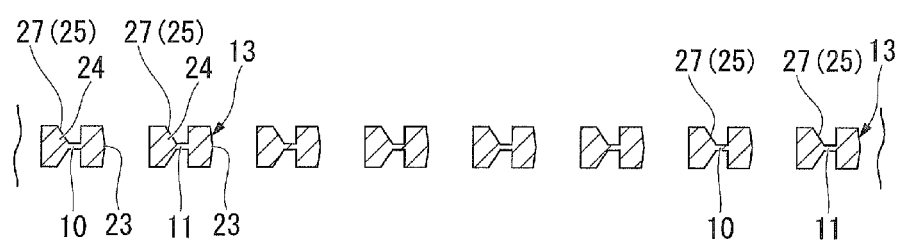
FIG.8
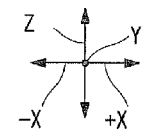

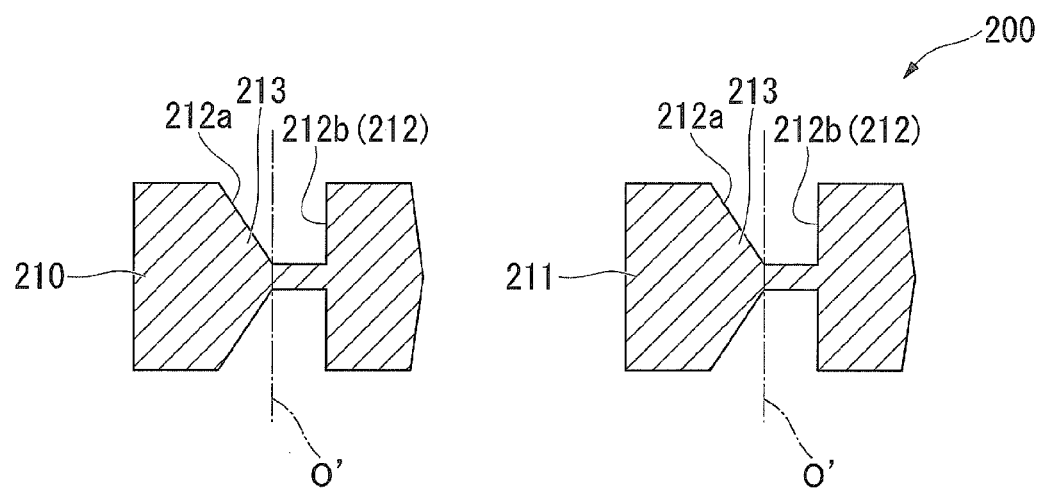
FIG.16
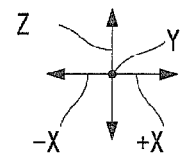
PRIOR ART

PIEZOELECTRIC VIBRATING PIECE, PIEZOELECTRIC VIBRATOR, OSCILLATOR, ELECTRONIC APPARATUS AND RADIO TIMEPIECE

RELATED APPLICATIONS

This application claims benefit of priority under 35 U.S.C. §119 to Japanese Patent Application No. 2012-204611, filed Sep. 18, 2012, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic apparatus and a radio timepiece.

2. Description of the Related Art

In a cellular phone or portable information terminal devices, a piezoelectric vibrator using quartz crystal and so on is used as a time source, a timing source of a control signal, a reference-signal source and so on. Various types of piezoelectric vibrators have been provided, and a piezoelectric vibrator having a so-called tuning-fork type piezoelectric vibrating piece is known as one of the piezoelectric vibrators.

FIG. 16 is a cross-sectional view showing a related-art piezoelectric vibrating piece.

As shown in FIG. 16, a tuning-fork type piezoelectric vibrating piece 200 includes a pair of vibrating arm portions 210 and 211 arranged in parallel and a base portion (not shown) supporting base end portions of the pair of vibrating arm portions 210 and 211. Additionally, an electrode film is formed on an outer surface of the piezoelectric vibrating piece 200, and the pair of vibrating arm portions 210 and 211 can be vibrated in a direction moving close to or away from each other at a predetermined resonant frequency when a voltage is applied to the electrode film.

Incidentally, as apparatuses on which the piezoelectric vibrator is mounted are becoming small in size in recent years, the piezoelectric vibrating piece 200 is also desired to be small in size. However, for example, when the width of the vibrating arm portions 210 and 211 is narrowed, the forming width of the electrode film formed on the vibrating arm portions 210 and 211 is also narrowed, as a result, an equivalent series resistance value (crystal impedance (CI) value) is increased and accuracy of an output signal is deteriorated.

In response to the above, a structure in which groove portions 212 are formed on both main surfaces of the vibrating arm portions 210 and 211 by etching processing as shown in FIG. 16 is known. According to the structure, excitation electrodes (not shown) to be paired face to each other on side surfaces of the groove portions 212, therefore, an electric field can be acted in the facing direction efficiently. Accordingly, even when the width of the vibrating arm portions 210 and 211 is narrowed, the electric field efficiency can be increased and miniaturization can be realized while maintaining a resonant frequency F.

An example of the related art includes JP-A 2009-81520.

However, in the case where the groove portions 212 are formed in the vibrating arm portions 210 and 211 of the piezoelectric vibrating piece 200, rigidity of the vibrating arm portions 210 and 211 is reduced. In particular, when the groove portions are formed in the vicinity of a connecting portion between the base end portions of the vibrating arm portions 210, 211 and the base portion, it is difficult to obtain sufficient strength of the vibrating arm portions 210 and 211, and stress concentration may occur at the portion. Accordingly, when an external impact and the like are applied to the piezoelectric vibrating piece 200, there is a danger that a fracture and so on occur from the vicinity of the connecting portion between the base end portions of the vibrating arm portions 210, 211 and the base portion. That is, there is a problem that the rigidity of the vibration arm portions is reduced when the groove portions 212 are provided in the vibrating arm portions 210 and 211.

Moreover, in the case where the groove portions 212 are formed at the vibrating arm portions 210 and 211, there is the following problem in addition to the above "problem that the rigidity of the vibrating arm portions is reduced". That is, the groove portions 212 are formed by performing wet etching to a wafer made of quartz crystal or the like by using a mask pattern. The material of quartz crystal or the like has given crystal axes, having a property in which etching speed differs according to the crystal-axis direction. Such property is also called "etching anisotropy". Specifically, it is known that the etching speed is reduced in the order of Z axis, +X axis, −X axis and Y axis in respective crystal axes (X axis, Y axis and Z axis) of quartz crystal. As the material has the "etching anisotropy", it is known that the cross-sectional shape of the groove portion 212 obtained after the etching is not a simple rectangle but a shape having inclined surfaces as shown in FIG. 16.

Here, a portion of the inclined surfaces in the groove portion 212 as shown in FIG. 16 is called an "etching residue 213". Normally, when the tuning-fork type piezoelectric vibrating piece 200 is formed, the wafer is cut from a rude ore of quartz crystal so that the Z axis of the crystal axes approximately corresponds to a thickness direction of the piezoelectric vibrating piece 200, the Y axis approximately corresponds to a length direction of the piezoelectric vibrating piece 200 and the X axis approximately corresponds to a width direction of the piezoelectric vibrating piece 200 for obtaining a desired outer shape by the etching processing. At the time of forming the groove portion 212, the etching residue 213 is generated on the side surface of the groove portion 212 being affected by the etching anisotropy described above. Specifically, the delay occurs in the etching speed as coming from the +X axis direction side toward the −X axis direction side, therefore, a −X axis side surface 212a positioned on the −X axis side in side surfaces facing to each other in the X-axis direction in the groove portion 212 will be an inclined surface gradually inclining toward the +X-axis direction as coming toward a bottom portion of the groove portion 212. Then, the inclined portion will be the etching residue 213 described above. Note that a +X axis side surface 212b positioned on the +X axis side will be a side surface parallel to the Z-axis direction (the side surface not having the etching residue 213). The etching residues are formed not only on the groove portions 212 but also on side surfaces of the vibrating arm portions 210 and 211. In FIG. 16, the inclinations (etching residues) are formed on side surfaces on the +X axis side in both side surfaces of the vibrating arm portions 210 and 211.

When the etching residue 213 is generated in the groove portion 212, shapes are different on both sides with respect to a center line O' dividing each of the vibrating arm portions 210 and 211 in half in the X-axis direction, and the weight balance is lost. As a result, there are problems that variation of drive-level characteristics of the vibrating arm portions 210 and 211 (behavior of the resonant frequency F with respect to a voltage to be applied on the piezoelectric vibrating piece 200), increase of the CI value due to vibration leakage and so on occur. That is, when the groove portions 212 are provided on the vibrating arm portions 210 and 211, there is also "a problem that the vibration balance is lost" due to the etching residue 213 in addition to the "problem that the rigidity of the vibrating arm portions is reduced".

SUMMARY OF THE INVENTION

In view of the above, an object of the present invention is to provide a piezoelectric vibrating piece, a piezoelectric vibrator, an oscillator, an electronic apparatus and a radio timepiece having the piezoelectric vibrating piece capable of correcting vibration imbalance while suppressing reduction of rigidity in the piezoelectric vibrating piece provided with the groove portions in the vibrating arms.

In order to achieve the above object, the present invention provides a tuning-fork type piezoelectric vibrating piece including a pair of vibrating arm portions arranged in parallel to each other, a base portion integrally fixing base end portions of the pair of vibrating arm portions in a length direction, groove portions formed on main surfaces of the pair of vibrating arm portions and extending along the length direction, in which a thickness direction of the vibrating arm portions is a Z axis direction of crystal axes, the length direction of the vibrating arm portions is a Y axis direction of crystal axes and a width direction orthogonal to the length direction and the thickness direction of the vibrating arm portions is an X axis direction of crystal axes, and each of the groove portions includes a first groove portion formed on a tip portion side of the vibrating arm portions and a second groove portion formed closer to the base-end portion side of the vibrating arm portions with respect to the first groove portion, and the second groove portion is arranged so as to be offset in a –X axis direction with respect to the first groove portion in the X axis direction.

According to the structure, the groove portion is divided into the first groove portion and the second groove portion in the base end side of the vibrating arm portions, therefore, it is possible to suppress stress concentration to the base end portions of the vibrating arm portions and to increase the rigidity of the vibrating arms as compared with a case where one communicating groove portion is formed in the vibrating arm portion. Furthermore, as the second groove portion is arranged so as to be offset in the –X axis direction with respect to the first groove portion, it is possible to suppress variation in weight on both side portions of each vibrating arm portion in the X axis direction, which is caused by the etching residue generated at the time of forming the first groove portion. That is, the etching residue is generated in the –X axis direction side of the first groove portion when forming the first groove portion, and thus, weight on the –X axis direction side is increased with respect to the center line dividing the first groove portion in the X axis direction. However, when the second groove portion is formed to be offset to the –X axis direction side, the weight in –X axis direction is reduced as compared with the weight in +X axis direction in the second groove portion, therefore, variation in weight balance generated in the first groove portion can be reduced. As a result, it is possible to reduce variation in weight balance of right and left with respect to the center line along a longitudinal direction of the vibrating arm as the vibration center as the whole view of the vibrating arm portions.

In the above structure, a groove width of the second groove portion is narrower than a groove width of the first groove portion.

According to the structure, as the groove widths of the second groove portions can be narrowed on the base end side of the vibrating arm portions, stress concentration to the base end portions of the vibrating arm portions can be efficiently suppressed, which can further increase the rigidity of the vibrating arm portions.

A piezoelectric vibrator according to an embodiment of the invention includes the above piezoelectric vibrating piece and a package having a base substrate and a lid substrate bonded to each other, housing the piezoelectric vibrating piece in a cavity formed between both substrates. Accordingly, it is possible to provide the piezoelectric vibrator having excellent impact resistance and further, having excellent drive level characteristics.

In an oscillator according to an embodiment of the present invention, the piezoelectric vibrator is electrically connected to an integrated circuit as a resonator. Moreover, in an electronic apparatus according to an embodiment of the present invention, the piezoelectric vibrator is electrically connected to a timer unit. Furthermore, in a radio timepiece according to an embodiment of the present invention, the piezoelectric vibrator is electrically connected to a filter unit.

As the oscillator, the electronic apparatus and the ratio timepiece includes the above-described piezoelectric vibrator, high-quality products having excellent reliability and durability can be provided.

According to the embodiment of the present invention, as the piezoelectric vibrating piece provided with the groove portions in the vibrating arms, the piezoelectric vibrating piece capable of correcting the vibration imbalance while suppressing the reduction of rigidity can be provided, and also the piezoelectric vibrator, the oscillator, the electronic apparatus and the radio timepiece, each having the piezoelectric vibrating piece, can be provided.

BRIEF DESCRIPTION OF THE DRAWINGS

FIG. 7 is a process view showing the manufacturing method of the piezoelectric vibrating piece, which is a cross-sectional view taken along B-B line of FIG. 4;

FIG. 8 is a process view showing the manufacturing method of the piezoelectric vibrating piece, which is a cross-sectional view taken along B-B line of FIG. 4;

FIG. 16 is a cross-sectional view showing a related-art piezoelectric vibrating piece.

DETAILED DESCRIPTION OF THE PREFERRED EMBODIMENTS

Next, an embodiment of the present invention will be explained based on the drawings.
(Piezoelectric Vibrating Piece)

Figure 1:
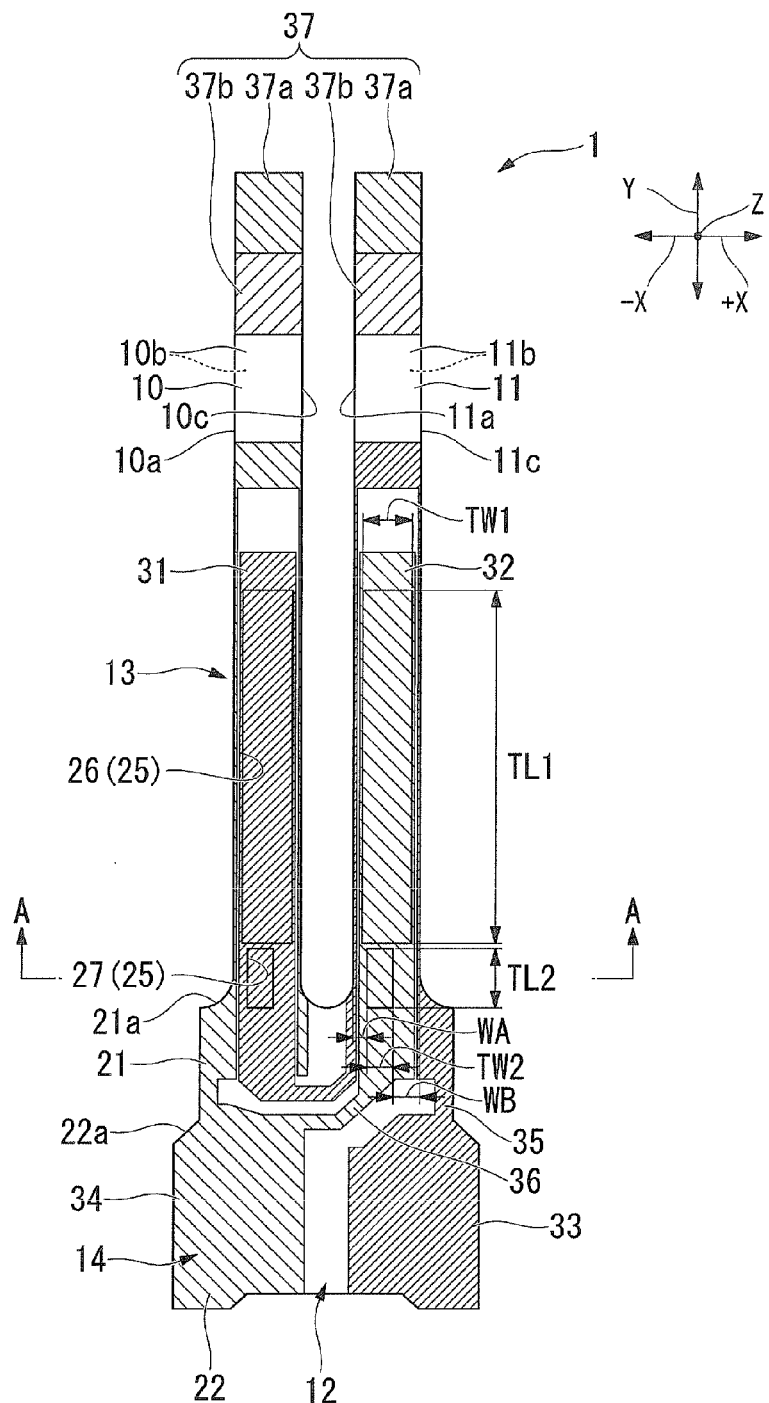
FIG. 1 is a plan view of a piezoelectric vibrating piece according to an embodiment of the present invention.
Figure 2:
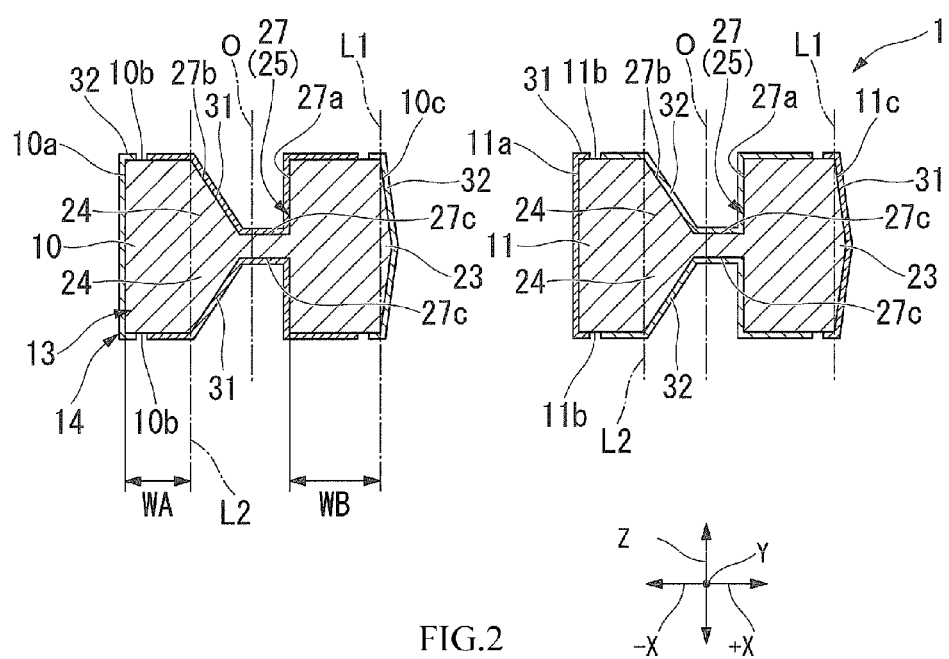
FIG. 2 is a cross-sectional view taken along A-A line of FIG. 1.

FIG. 1 is a plan view of a piezoelectric vibrating piece according to the embodiment of the present invention and FIG. 2 is a cross-sectional view taken along A-A line of FIG. 1.

As shown in FIG. 1 and FIG. 2, a piezoelectric vibrating piece 1 according to the embodiment is a tuning-fork type vibrating piece made of a piezoelectric material such as quartz crystal, lithium tantalate and lithium niobate, including a piezoelectric plate 13 having a base portion 12 integrally fixing a pair of vibrating arm portions 10, 11 and base end portions of the pair of vibrating arm portions 10, 11, and an electrode film 14 formed on the piezoelectric plate 13. The piezoelectric plate 13 according to the embodiment is formed by slicing a Lambert ore of quartz crystal at a given angle with respect to an X axis, a Y axis and a Z axis orthogonal to one another as crystal axes of quartz crystal to make a crystal wafer 40 (refer to FIG. 4) and by performing wet etching to the crystal wafer 40 as described later. In the piezoelectric plate 13 according to the embodiment, the Z axis of the crystal axes of quartz crystal approximately corresponds to a thickness direction of the piezoelectric plate 13, the Y axis approximately corresponds to a length direction of the piezoelectric plate 13 (the vibrating arm portions 10 and 11) and the X-axis corresponds to a width direction of the piezoelectric plate 13 (an arrangement direction of the vibrating arm portions 10 and 11).

The base portion 12 includes a first base portion 21 to which the vibrating arm portions 10 and 11 are connected and a second base portion 22 connected to a base end portion of the first base portion 21 and having a wider width than the first base portion 21 (a so-called two-step base portion type). Additionally, a connecting portion between the first base portion 21 and the base end portion of each of the vibrating arm portions 10, 11 and a connecting portion between respective base portions 21 and 22 are inclined surfaces 21a and 22a in which the width is gradually widened from a tip side toward the base end side along a Y axis direction. Though the shape of the base portion 12 is the two-step base portion type in the present embodiment, the shape of the base portion 12 is not limited to this, and a straight type having no step on a side surface of the base portion 12 or a notch type having a notch in an X axis direction of the base portion 12 may be applied. In the notch type, it is possible to obtain an effect of reducing "vibration leakage" in which vibration of the vibrating arm portions 10 and 11 is leaked to the package side through the base portion 12.

A pair of vibrating arm portions 10 and 11 extends along the Y axis direction as well as formed side by side in parallel to the X axis direction. −X axis side surfaces 10a and 11a positioned in a −X axis direction in both side surfaces facing in the X axis direction of respective vibrating arm portions 10 and 11 are formed approximately vertical to both main surfaces 10b and 11b. +X axis side surfaces 10c and 11c positioned in a +X axis direction are formed to be inclined surfaces inclining toward the +X axis direction as coming from the outside along a Z-axis direction (the main surfaces 10b, 11b side) to a central portion. That is, a portion swelling in the +X axis direction with respect to a first virtual line L1 extending from an end edge on the +X axis side of each of the both main surfaces 10b and 11b in each of the vibration arm portions 10 and 11 toward the Z-axis direction correspond to an etching residue 23 generated due to the etching anisotropy in a later-described outline forming process (S20).

Groove portions 25 which are concave toward the inside in the Z-axis direction and extending along the Y-axis direction are formed on the both main surfaces 10b and 11b of respective vibrating arm portions 10 and 11. Each groove portion 25 further includes a first groove portion 26 formed on a tip portion side along the Y-axis direction of each of the vibrating arm portions 10, 11 and a second groove portion 27 formed on a base-end portion side of the vibrating arm portions 10 and 11 with respect to the first groove portion 26. That is, the first groove portion 26 and the second groove portion 27 are formed side by side in the Y-axis direction on the both main surfaces 10b and 11b of respective vibrating arm portions 10 and 11 in the present embodiment. It is sufficient that the groove portions 25 are formed in one of the front surface and the rear surface of the vibration arm portions 10 and 11.

The first groove portion 26 extends from the base end portion of each of the vibrating arm portions 10 and 11 to the vicinity of an intermediate portion, which is formed over the entire portion in the Y-axis direction. Additionally, when the vibrating arm portions 10 and 11 are seen from the Z-axis direction, each first groove portion 26 is formed so as to be line symmetry with respect to a center line O passing through the center in the X-axis direction (a central position in the width direction) of each of the main surfaces 10b and 11b in respective vibrating arm portions 10 and 11. That is, the first groove portion 26 is formed in each the vibrating arm portions 10 and 11 so that a center line dividing the opening width of the first groove portion 26 in half in the X-axis direction approximately corresponds to the center line O of the vibrating arm.

The second groove portion 27 extends from the connecting portion between the vibrating arm portions 10, 11 and the base portion 12 to the vicinity of the base end portion of the first groove portion 26, which is arranged with a gap with respect to the first groove portion 26 in the Y-axis direction. Moreover, in the second groove portion 27, a length TL2 along the Y-axis direction is shorter than a length TL1 of the first groove portion 26 as well as a width TW2 along the X-axis direction is narrower than a width TW1 of the first groove 26 (refer to FIG. 1).

Additionally, as shown in FIG. 2, a +X axis side surface 27a positioned in the +X axis direction in both side surfaces facing to each other in the second groove portion 27 in the X-axis direction is formed approximately vertical to both main surfaces 10b and 11b. An −X axis side surface 27b positioned in the −X axis direction is an inclined surface inclining toward the +X axis direction as coming from the outer side to the inner side along the Z-axis direction. That is, the −X axis side surface 27b in the second groove portion 27 inclines so that the width TW2 in the second groove portion 27 in the X-axis direction gradually narrows toward the inner side of the Z-axis direction.

In this case, a portion swelling in the +X axis direction with respect to a second virtual line L2 extending from an end edge on the −X axis side of in an opening edge of the second groove portion 27 to the Z axis direction corresponds to an etching residue 24 generated due to the etching anisotropy in a later-described groove-portion forming process (S30). A bottom surface 27c of the second groove portion 27 is formed so as to be parallel to the both main surfaces 10b and 11b.

The second groove portion 27 according to the embodiment is formed to be offset in the −X axis direction with respect to the first groove portion 26. Specifically, the second groove portion 27 is provided so that a center line extending in the Y axis direction of the second groove portion 27 is offset in the −X axis direction from the center line O of the vibrating arm portions 10 and 11. In further other words, a width WB from an opening edge on the +X axis side of each second groove portion 27 to an end edge on the +X axis side of the both main surfaces 10b and 11b of each of vibrating arm portions 10 and 11 is wider than a width WA from an opening edge on the −X axis side of each second groove portion 27 to an end edge on the −X axis side of the both main surfaces 10b and 11b of each of the vibrating arm portions 10 and 11 (WB>WA).

Accordingly, a weight on the −X axis direction side with respect to the center line O of each of the vibrating arm portions 10 and 11 is increased in the first groove portion 26 due to the etching residue, and the weight balance between both sides of the center line O of each of the vibrating arm portions 10 and 11 in the X axis direction varies, however, the weight balance between both sides of the center line O in the X axis direction of each of the vibrating arm portions 10 and 11 is approximately equal or the weight in the +X axis direction is increased in the region where the second groove portion 27 is formed as the second groove portion 27 is formed to be offset in the in the −X axis direction. Accordingly, as the whole view of the vibrating arm portions 10 and 11, variation in the weight balance generated in the first groove portion 26 (variation caused by the increase of weight on the −X axis direction side) is reduced by the weight balance in the second groove portion 27, therefore, the weight balance between both sides of the center line O in the X axis direction can be approximately equivalent. The weight balance in the root (base-end side) largely affects the vibration of the vibrating arm portions 10 and 11 as compared with the weight balance of the tip side of the vibrating arm portions 10 and 11. Accordingly, in the case where the weight balance in the whole vibrating arm portions 10 and 11 is not achieved in both sides in the X-axis direction even when the second groove portion 27 is formed to be offset (in the case where the weight on the −X axis direction side is still higher than the weight on the +X axis direction side), drive level characteristics of the vibrating arm portions 10 and 11 can be largely increased and thus an accurate and stable resonant frequency can be obtained as long as the weight balance between both sides of the center line O in the X axis direction is achieved in the second groove portion 27.

Additionally, the electrode film 14 for allowing these vibrating arms to perform bending vibration is formed in the vibrating arm portions 10 and 11. The electrode film 14 includes a first excitation electrode 31 and a second excitation electrode 32 formed in the pair of vibrating arm portions 10 and 11 for vibrating the pair of vibrating arm portions 10 and 11, a first mount electrode 33 and a second mount electrode 34 electrically connected to the first excitation electrode 31 and the second excitation electrode 32 respectively, and lead-out electrodes 35, 36 electrically connecting the excitation electrodes 31, 32 to the mount electrodes 33, 34 respectively. The electrode film 14 is formed by, for example, a stacked film of chrome (Cr) and gold.

The excitation electrodes 31 and 32 are formed on an outer surface of the pair of vibrating arm portions 10 and 11. The excitation electrodes 31 and 32 vibrate the pair of vibrating arm portions 10 and 11 so as to move close to or away from each other in the X axis direction at a given resonant frequency F when a voltage is applied.

The pair of excitation electrodes 31 and 32 is formed by being patterned respectively in an electrically separated state on the outer surfaces of the pair of vibrating arm portions 10 and 11.

Specifically, the first excitation electrode 31 is mainly formed on an inner surface of the groove portion 25 of the vibrating arm 10, the +X axis side surface 11c and the −X axis side surface 11a of the vibrating arm 11. The second excitation electrode 32 is mainly formed on an inner surface of the groove portion 25 of the vibrating arm 11, +X axis side surface 10c and the −X axis side surface 10a of the vibrating arm 10.

The mount electrodes 33 and 34 are formed side by side in the X axis direction at base end portions on the main surface of the base portion 12.

The first lead-out electrode 35 of the lead-out electrodes 35 and 36 connects the first excitation electrode 31 to the first mount electrode 33, and the second lead-out electrode 36 connects the second excitation electrode 32 to the second mount electrode 34. It is sufficient that the mount electrodes 33, 34 and the lead-out electrodes 35, 36 are formed at least one main surface of both main surfaces of the piezoelectric plate 13.

At tip portions of the vibrating arm portions 10 and 11, a weighted metal film 37 including a coarse adjustment film 37a and a fine adjustment film 37b for performing adjustment (frequency adjustment) so that the arm portions vibrate within a given frequency. As the frequency adjustment is performed by using the weighted metal film 37, the frequency of the pair of vibrating arm portions 10 and 11 can fall within the range of a nominal frequency of the device.

(Manufacturing Method of Piezoelectric Vibrator)

Next, a manufacturing method of the piezoelectric vibrating piece 1 will be explained.

Figure 3:
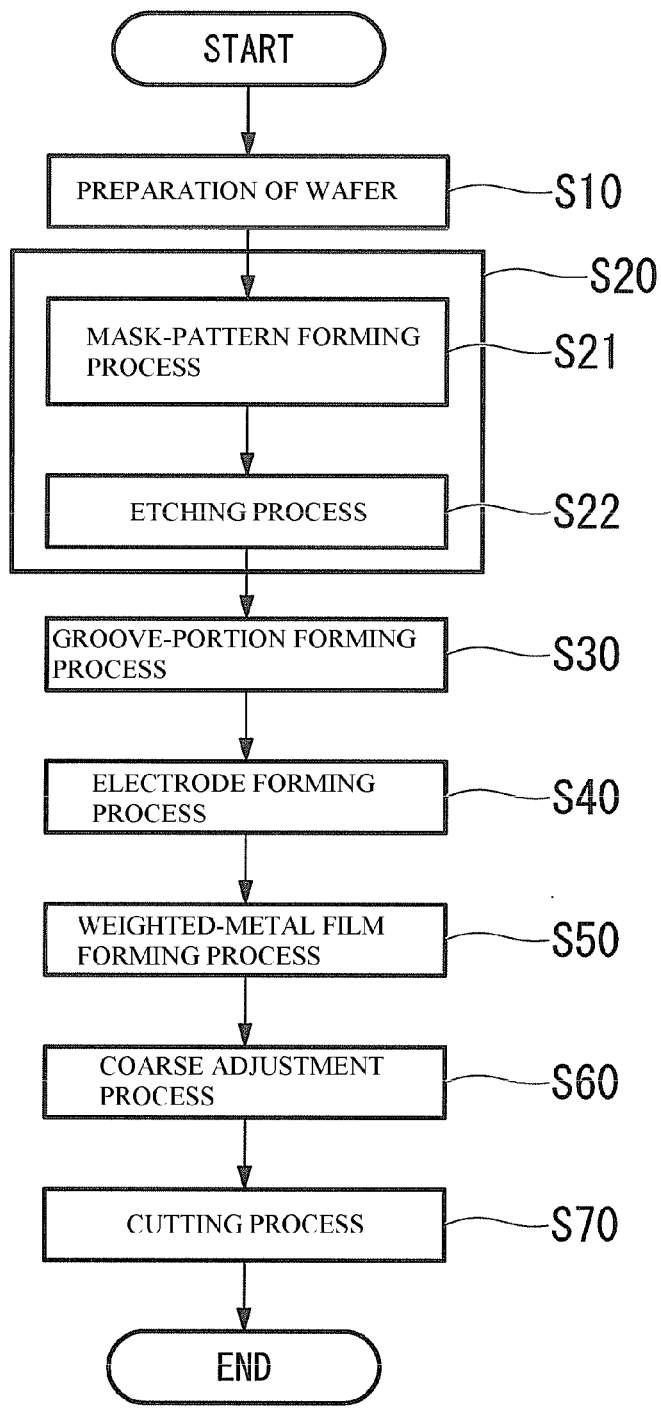
FIG. 3 is a flowchart showing a manufacturing method of the piezoelectric vibrating piece.

FIG. 3 is a flowchart showing a manufacturing method of the piezoelectric vibrating piece. FIG. 4 to FIG. 8 are process views for explaining the manufacturing method of the piezoelectric vibrating piece, and FIG. 5 to FIG. 8 are cross-sectional views corresponding to B-B line of FIG. 4.

Figure 4:
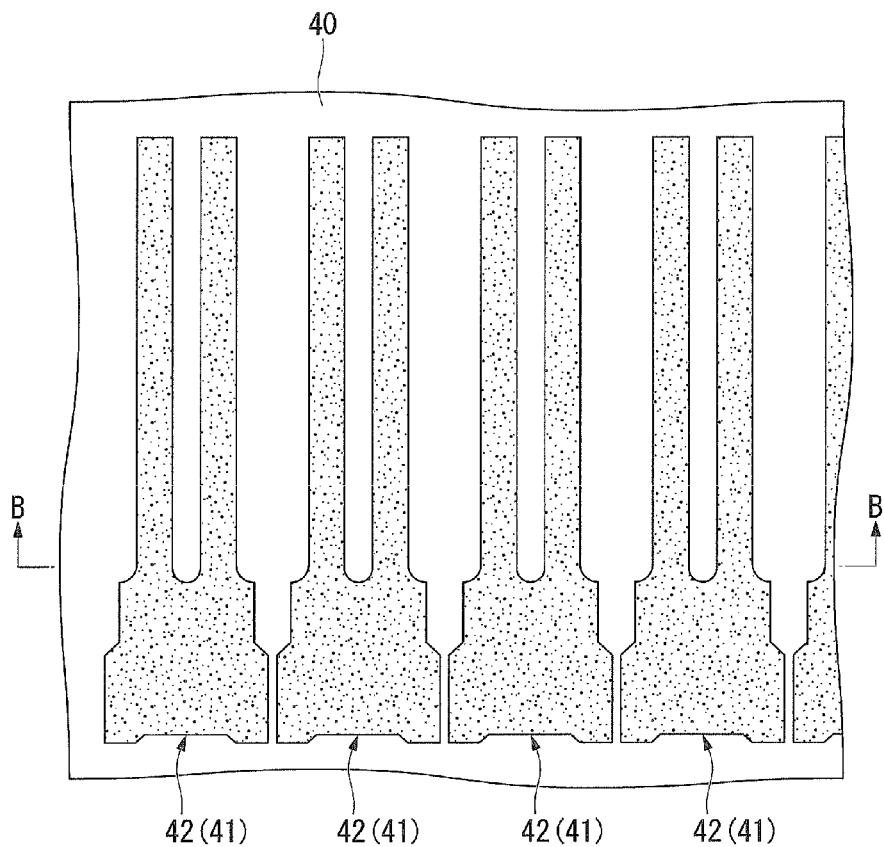
FIG. 4 is a process view showing the manufacturing method of the piezoelectric vibrating piece, which is a plan view of a crystal wafer.
Figure 4:
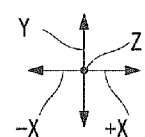

First, as shown in FIG. 3 and FIG. 4, a Lambert ore of quartz crystal is sliced at a given angle to make the crystal wafer 40 having a predetermined thickness (S10). At this time, the crystal wafer is sliced so that the Z axis approximately corresponds to the thickness direction of the piezoelectric vibrating piece 1, the Y axis approximately corresponds to the length direction of the piezoelectric vibrating piece 1 (the vibrating arm portions 10 and 11) and the X-axis corresponds to the width direction of the piezoelectric vibrating piece 1 (an arrangement direction of the vibrating arm portions 10 and 11). Next, after the crystal wafer 40 is wrapped and coarse processing is performed, an affected layer is removed by etching, then, mirror processing such as polishing is performed to obtain a given thickness.

Figure 5:
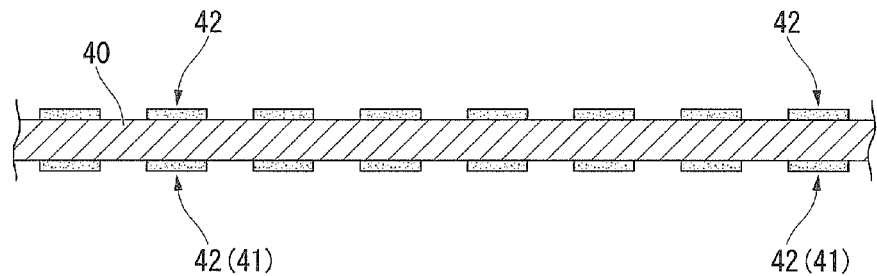
FIG. 5 is a process view showing the manufacturing method of the piezoelectric vibrating piece, which is a cross-sectional view taken along B-B line of FIG. 4.
Figure 6:
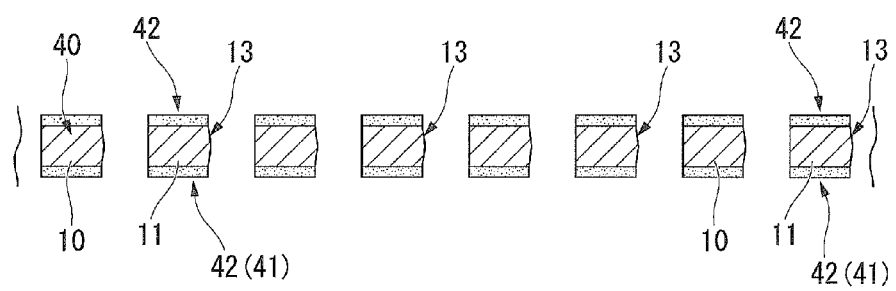
FIG. 6 is a process view showing the manufacturing method of the piezoelectric vibrating piece, which is a cross-sectional view taken along B-B line of FIG. 4.

Subsequently, the outline forming process (S20) in which outer shapes of plural piezoelectric plates 13 are formed on the crystal wafer 40 is performed as shown in FIG. 3 to FIG. 5. The outline forming process (S20) has a mask-pattern forming process (S21) in which an etching protection film 41 is formed on both main surfaces of the crystal wafer 40 and a mask pattern 42 corresponding to the outer shapes of the piezoelectric vibrating pieces 1 from the etching protection film 41 by a photolithography technique, and an etching process (S22) in which etching processing is performed from the sides of both main surfaces of the crystal wafer 40 by wet etching using the mask pattern 42 as a mask.

In the mask-pattern forming process (S21), first, the etching protection film 41 is formed over the whole of both main surfaces of the crystal wafer 40. As the etching protection film 41, for example, a metal film formed by stacking a base film made of chrome and a finishing film made of gold can be cited, which is formed by deposition using a sputtering method, a deposition method and so on.

Then, the mask pattern 42 corresponding to the outer shapes of the piezoelectric vibrating pieces 1 is formed by patterning the etching protection film 41. Specifically, after a not-shown photoresist film is formed on the etching protection film 41, patterning is performed, for example, to be the outer shapes of the piezoelectric vibrating pieces 1 by a normal photoresist technique. Then, etching processing is performed by using the photoresist film as a mask to selectively remove portions of the etching protection film 41 which are not masked. Then, after etching processing, the photoresist film used as the mask is removed.

Next, etching processing (wet etching) is performed by using the patterned mask pattern 42 as a mask (S22). Specifically, the crystal wafer 40 on which the mask pattern 42 is formed is dipped in a not-shown etching etchant (for example, a fluorine-based etchant) for a predetermined period of time to selectively remove portions in the crystal wafer 40 not masked by the mask pattern 42. Accordingly, the crystal wafer 40 can be etched in accordance with the shape of the mask pattern 42, thereby forming the outer shapes of the piezoelectric plates 13. Note that plural piezoelectric plates 13 are connected to the crystal wafer 40 through not-shown connecting portions until a subsequent cutting process (S70) is performed.

Next, as shown in FIG. 7, the groove-portion forming process (S30) of forming the groove portions 25 (refer to FIG. 1) on the both main surfaces 10a, 11b of the vibrating arm portions 10 and 11 in the piezoelectric plates 13. Specifically, the mask pattern 42 is patterned again so that forming regions of the groove portions 25 open in the above mask pattern 42. In this case, forming regions of the first groove portions 26 are formed so as to be line symmetry with respect to the center line O, and forming regions 42a of the second groove portions 27 are formed so as to be offset in the −X axis direction with respect to center line O in opening portions of the mask pattern 42. Then, etching processing (wet etching) is performed by using the patterned mask pattern 42 as the mask in the same manner as the above outline forming process (S20). Accordingly, regions not masked by the mask pattern 42 in the crystal wafer 40 are selectively removed as shown in FIG. 8, thereby forming the groove portions 25 respectively on the both main surfaces 10b and 11b of pairs of vibrating arm portions 10 and 11. After that, the mask pattern 42 is removed.

In the outline forming process (S20) and the groove-portion forming process (S30), the above-described etching residues 23, 24 are generated by being affected by the etching anisotropy. In this case, as etching time of the groove-portion forming process (S30) is set to be shorter than the outline forming process (S20), the etching residues 24 generated in the groove-portion forming process (S30) will be larger than the etching residues 23 generated in the outline-forming process (S20).

Next, an electrode forming process (S40) of respectively forming the excitation electrodes 31, 32, the mount electrodes 33, 34 and the lead-out electrodes 35, 36 on plural piezoelectric plates 13 is performed by patterning the electrode film 14 using, for example, the sputtering method and the like. Moreover, a weighted-metal film forming process (S50) of forming the weighted metal films 37 at tips of the pairs of vibrating arm portions 10 and 11 is performed.

The electrode forming process (S40) and the weighted-metal film forming process (S50) may be performed in separate processes or may be performed at the same time in the same process.

Next, a coarse adjustment process (S60) of coarsely adjusting frequencies is performed to all vibrating arm portions 10 and 11 formed on the crystal wafer 40. At this time, frequencies of all vibrating arm portions 10 and 11 formed on the crystal wafer 40 are simultaneously measured, and trimming amounts are calculated based on the difference between measured frequencies and a predetermined target frequency. Then, the coarse adjustment films 37a of the weighted metal films 37 are irradiated with laser light to evaporate part of the films, thereby removing the coarse adjustment films 37a in accordance with the trimming amounts. The fine adjustment adjusting the resonant frequency F more accurately is performed after the piezoelectric vibrating piece 1 is mounted.

Next, a cutting process (S70) of cutting connecting portions connecting between the crystal wafer 40 and the piezoelectric plates 13 and separating plural piezoelectric plates 13 from the crystal wafer 40 into individual pieces is performed.

According to the above processes, plural tuning-fork type piezoelectric vibrating pieces 1 are manufactured from the single crystal wafer 40 at a time.

As described above, the present embodiment has a structure in which the first groove portions 26 formed on the tip portion side of the vibrating arm portions 10 and 11 extending along the Y axis and the second groove portions 27 formed on the base-end portion side of the vibrating arm portions 10 and 11 extending along the Y axis with respect to the first groove portions 26, in which the width along the X axis is narrower than the first groove portions 26.

When applying the structure, the width TW2 of the second groove portion 27 is narrower than the width TW1 of the first groove portion 26, thereby increasing the rigidity of the base end portions in the vibrating arm portions 10 and 11, therefore, it is possible to suppress the stress to be concentrated on the base end portions of the vibrating arm portions 10 and 11. As a result, it is possible to prevent occurrence of fracture and so on of the piezoelectric vibrating piece 1 even when an external impact and the like are applied to the piezoelectric vibrating piece 1.

Particularly, the second groove portion 27 is formed to be offset in the −X axis direction with respect to the center line O of each of the vibrating arm portions 10 and 11.

According to the structure, it is possible to suppress variation in weight balance of the vibrating arm portions 10 and 11 due to the etching residues 24 generated at the time of forming a groove portion. Accordingly, the weight balance of the vibrating arm portions 10 and 11 can be kept, which can improve drive level characteristics and can reduce the CI value by suppressing vibration leakage. As a result, it is possible to provide the piezoelectric vibrating piece 1 capable of reducing the size while suppressing reduction of rigidity and having excellent vibration characteristics.

Also in the present embodiment, the first groove portion 26 formed without being offset with respect to the vibrating arm portions 10 and 11, that is, the first groove portion 26 is formed so that the center line of the first groove portion 26 approximately corresponds to the center line O of each of the vibrating arm portions 10 and 11. However, the shape of the first groove portion 26 is not limited to this, and it is also preferable that the first groove portion 26 may be offset in the −X axis direction side. According to the structure, variation in weight balance due to the etching residue of the first groove portion 26 can be reduced by alignment of the first groove portion 26 in the X axis direction. When the second groove portion 27 is also formed to be offset with respect to the first groove portion 26 in addition to the above, it is possible to reduce variation in weight balance of the vibrating arm portions 10 and 11 more effectively.

Although the groove width of the first groove portion 26 is formed to be larger than the groove width of the second groove portion 27, the size relation of the groove width is not limited to the above. That is, the groove width may be the same in the groove portion 26 and the groove portion 27 as long as the rigidity of vibrating arms can be secured even when the groove width of the second groove portion 27 is not narrowed.

Figure 9:
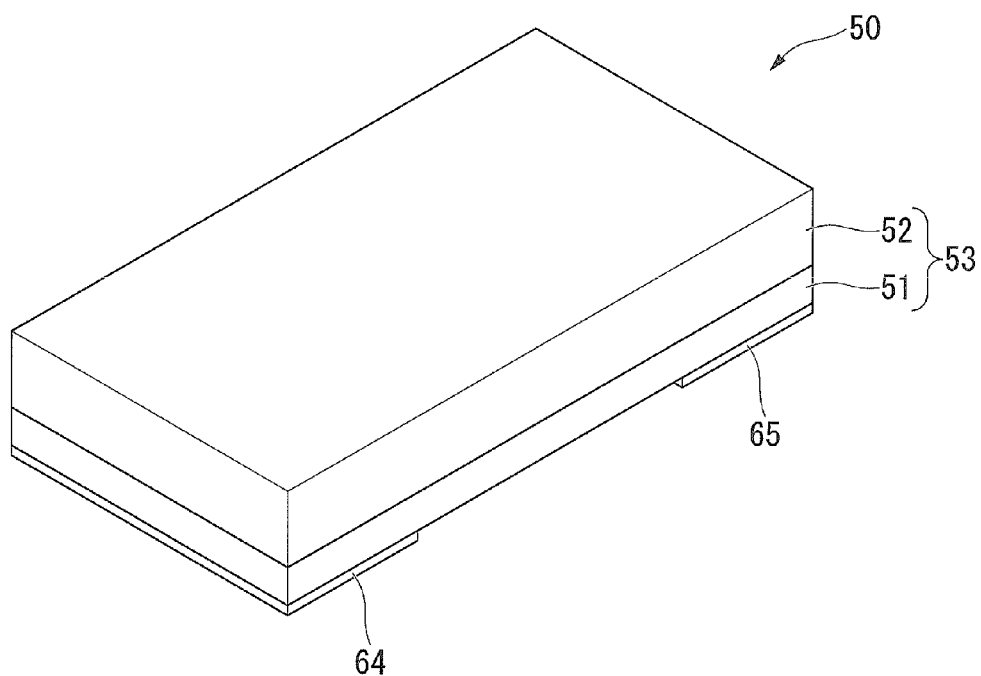
FIG. 9 is an external perspective view showing a piezoelectric vibrator.
Figure 10:
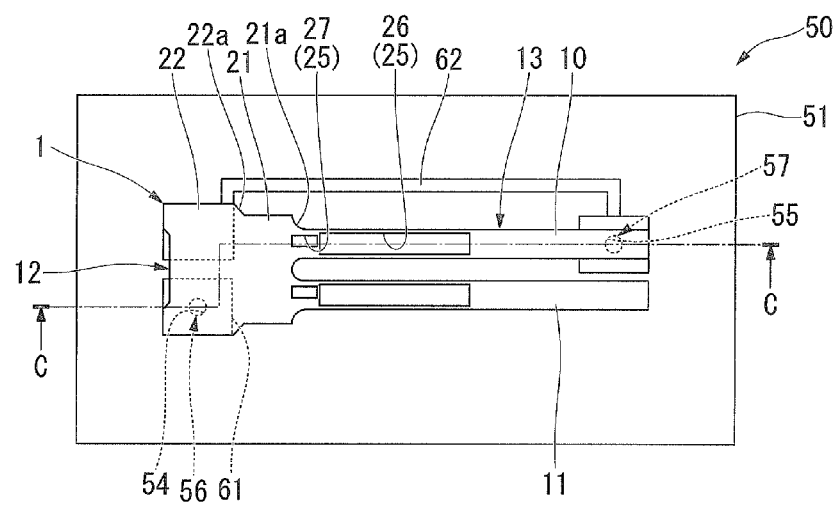
FIG. 10 is an inside structure view of the piezoelectric vibrator shown in FIG. 9, which is a plan view in a state of removing a lid substrate.
Figure 11:
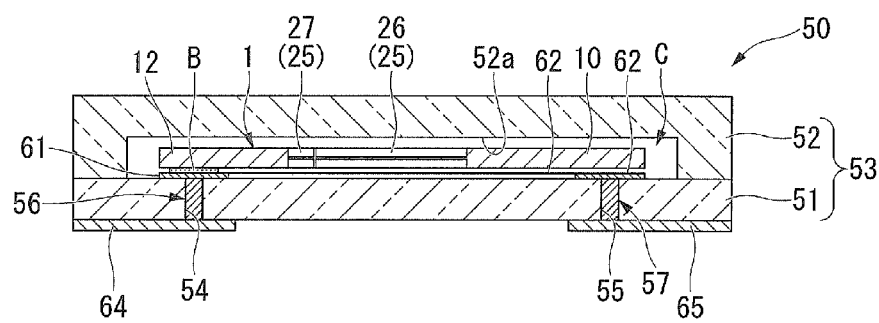
FIG. 11 is a cross-sectional view taken along C-C line of FIG. 10.
Figure 12:
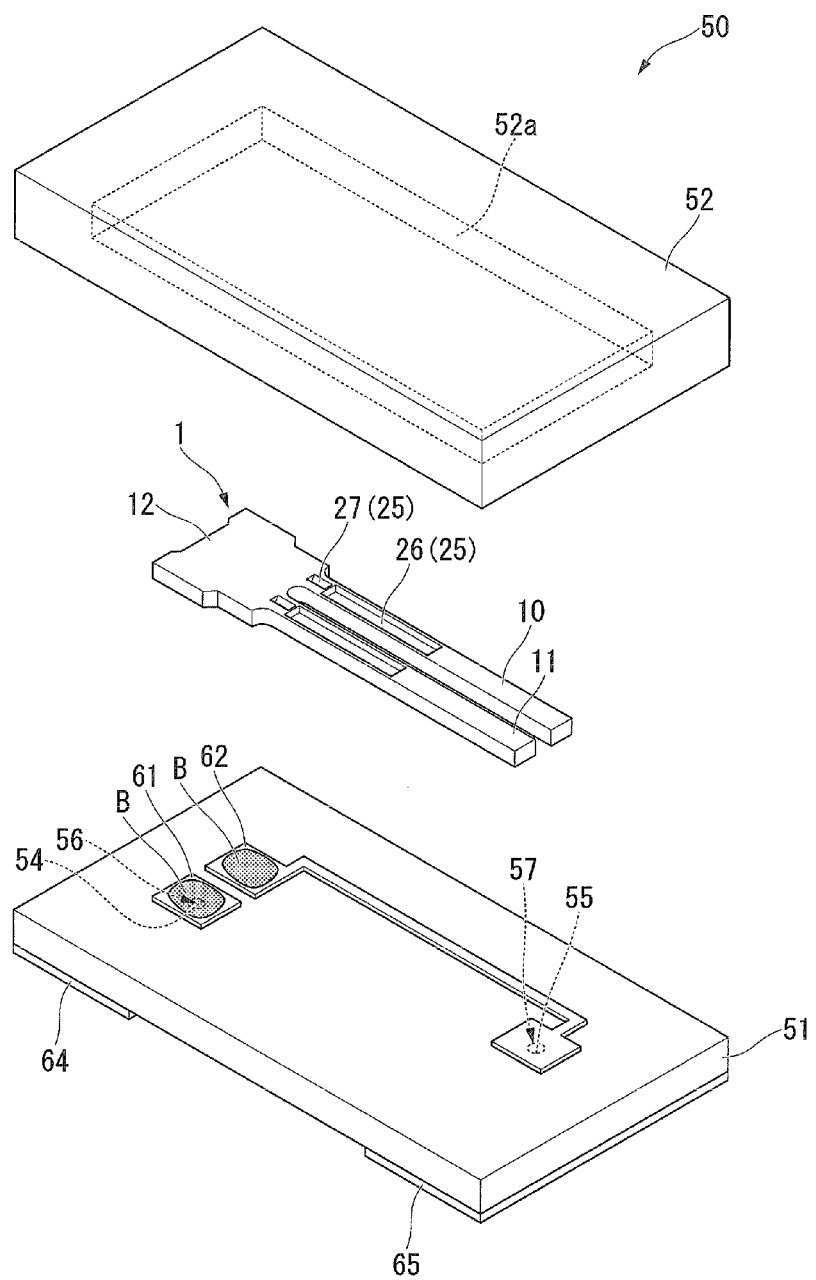
FIG. 12 is an exploded perspective view of the piezoelectric vibrator shown in FIG. 9.

Next, a piezoelectric vibrator 50 including the above piezoelectric vibrating piece 1 will be explained. FIG. 9 is an external perspective view showing the piezoelectric vibrator and FIG. 10 is an inside structure view of the piezoelectric vibrator shown in FIG. 9, which is a plan view in a state of removing a lid substrate. FIG. 11 is a cross-sectional view taken along C-C line of FIG. 10, and FIG. 12 is an exploded perspective view of the piezoelectric vibrator shown in FIG. 9. In the following description, structures common to the above structures are denoted by the same reference numerals and explanation thereof is omitted. Also in the embodiment, the etching residues 23, 24, the electrode film 14, the weighted metal film 37 and the like are not shown.

As shown in FIG. 9 to FIG. 12, the piezoelectric vibrator 50 according to the embodiment is a surface mounted type including a package 53 in which a base substrate 51 and a lid substrate 52 are bonded, for example, by anodic bonding, or through a not-shown bonding film, solder, a brazing material and so on, and the piezoelectric vibrating piece 1 housed in a cavity C formed inside the package 53. The explanation will be made in a case of using a glass material as a material for the package, however, the package capable of housing the piezoelectric vibrating piece according to the invention is not limited to this, and a ceramic package using a ceramic material as the base substrate and a ceramic or metal lid as the lid substrate may be applied.

The base substrate 51 and the lid substrate 52 are transparent insulating substrates made of a glass material such as soda-lime glass, which is formed to have an approximately plate shape. In the lid substrate 52, a concave portion 52a for housing the piezoelectric vibrating piece 1 on a bonding surface side to which the base substrate 51 is bonded. The concave portion 52a forms the cavity C housing the piezoelectric vibrating piece 1 when the base substrate 51 and the lid substrate 52 overlap each other.

In the base substrate 51, a pair of through holes 54 and 55 penetrating the base substrate 51 in the thickness direction is formed. The through holes 54 and 55 are formed at positions to be housed inside the cavity. In more detail, the through holes 54 and 55 according to the embodiment are provided so that one through hole 54 is formed at a position corresponding to the base portion 12 side of the mounted piezoelectric vibrating piece 1 and the other through hole 55 is formed at a position corresponding to the tip portion side of the vibrating arm portion 11.

In the pair of through holes 54 and 55, a pair of through electrodes 56 and 57 formed so as to fill in these through holes 54 and 55 is formed. These through electrodes 56 and 57 are, for example, conductive core materials integrally fixed to the through holes 54 and 55, which are formed so that both ends are flat as well as to be approximately the same thickness as the thickness of the base substrate 51. Accordingly, electrical conductivity is secured on both surfaces of the base substrate 51 while maintaining airtightness inside the cavity C.

The through electrodes 56 and 57 are not limited to the above structure, and may be formed by, for example, inserting not-shown metallic pins into the through holes 54 and 55, filling between the through holes 54, 55 and the metallic pins with glass frit and calcining them. It is further preferable that through electrodes 56 and 57 may be conductive adhesive buried in the through holes 54, 55.

On an upper surface of the base substrate 51 (a bonding surface to which the lid substrate 52 is bonded), a pair of layout electrodes 61 and 62 are patterned. Additionally, bumps B respectively made of gold and the like are formed on the pair of layout electrodes 61 and 62, and the pair of mount electrodes 33 and 34 are mounted by using the bumps B. Accordingly, one mount electrode 33 of the piezoelectric vibrating piece 1 is electrically connected to one through electrode 56 through one layout electrode 61, and the other mount electrode 34 is electrically connected to the other through electrode 57 through the other layout electrode 62.

On a lower surface of the base substrate 51, a pair of external electrodes 64 and 65 is formed. The pair of external electrodes 64 and 65 is formed on both end portions of the base substrate 51 in a longitudinal direction and is electrically connected to the pair of through electrodes 56 and 57.

When the piezoelectric vibrator 50 having the above structure is activated, a given drive voltage is applied to the external electrodes 64 and 65 formed on the base substrate 51. Accordingly, it is possible to allow electric current to flow in the excitation electrodes of the piezoelectric vibrating piece 1, which can vibrate the pair of vibrating arm portions 10 and 11 in a direction moving close to or away from each other at a predetermined frequency. Additionally, the piezoelectric vibrator 50 can be used as a time source, a timing source of a control signal, a reference-signal source and so on by utilizing the vibration of the pair of vibrating arm portions 10 and 11.

As the piezoelectric vibrator 50 according to the embodiment includes the high-quality and small piezoelectric vibrating piece 1 having stable vibration characteristics, in which breakage due to the external impact hardly occurs in the vibrating arm portions 10 and 11, therefore, the high-quality piezoelectric vibrator 50 having improved reliability and durability in activation can be realized.

(Oscillator)

Next, an oscillator according to an embodiment of the present invention will be explained with reference to FIG. 13.

Figure 13:
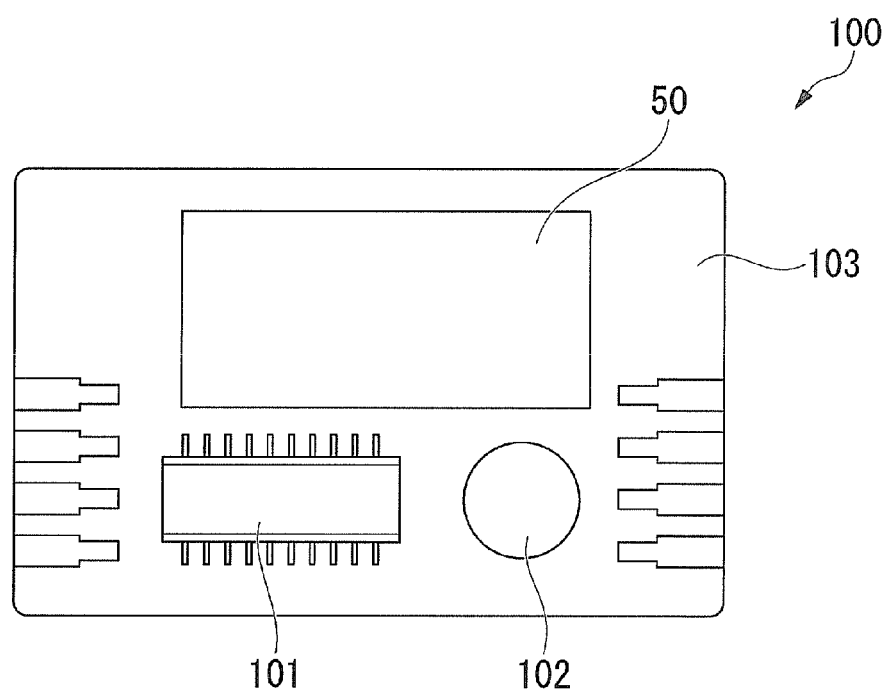
FIG. 13 is a view showing an embodiment of the present invention, which is a structure view of an oscillator.

An oscillator 100 according to the embodiment uses the piezoelectric vibrator 50 as a resonator electrically connected to an integrated circuit 101 as shown in FIG. 13. The oscillator 100 includes a substrate 103 on which an electronic component 102 such as a capacitor is mounted. The integrated circuit 101 for the oscillator is mounted on the substrate 103 and the piezoelectric vibrator 50 is mounted in the vicinity of the integrated circuit 101. The electronic component 102, the integrated circuit 101 and the piezoelectric vibrator 50 are electrically connected to one another by a not-shown wiring pattern. Note that respective components are molded by a not-shown resin.

In the oscillator 100 having the above structure, when a voltage is applied to the piezoelectric vibrator 50, the piezoelectric vibrating piece 1 inside the piezoelectric vibrator 50 vibrates. The vibration is converted into an electric signal by piezoelectric characteristics possessed by the piezoelectric vibrating piece 1 and inputted into the integrated circuit 101 as the electric signal. Various processing is performed to the inputted electric signal by the integrated circuit 101 and outputted as a frequency signal.

Accordingly, the piezoelectric vibrator 50 functions as the resonator.

In the configuration of the integrated circuit 101, for example, an RTC (real time clock) module is selectively set according to a request, thereby adding functions of controlling a single-function oscillator for a timepiece, operation dates, time of the device or external devices, as well as providing time, a calendar and so on.

As described above, the oscillator 100 according to the embodiment includes the high-quality piezoelectric vibrator 50 having improved reliability and durability in activation, therefore, it is possible to provide the oscillator 100 having high quality with excellent reliability and durability as well as capable of obtaining a stable and highly-accurate frequency signal for a long period of time.

(Electronic Apparatus)

Figure 14:
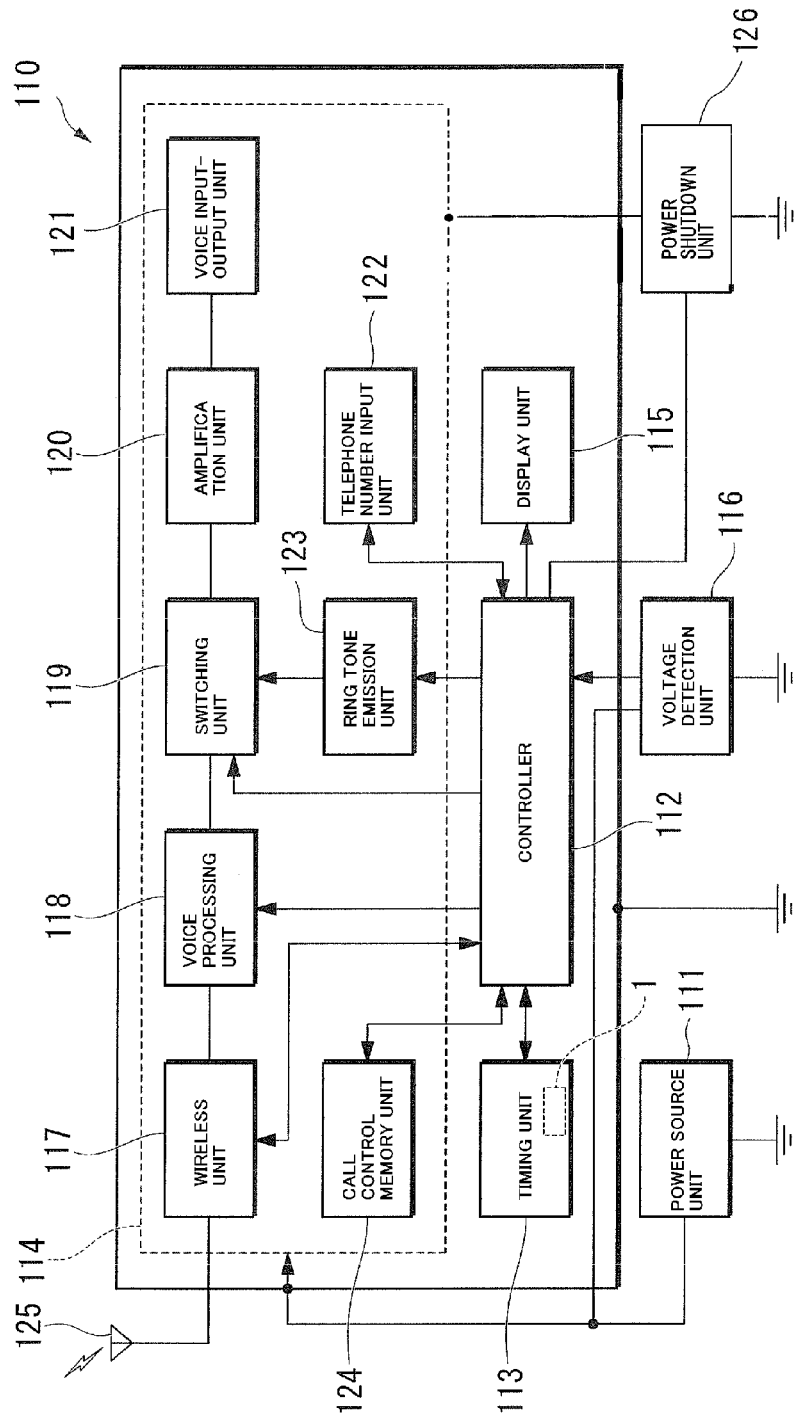
FIG. 14 is a view showing an embodiment of the present invention, which is a structure view of an electronic apparatus.

Next, an electronic apparatus according to an embodiment of the present invention will be explained with reference to FIG. 14. The explanation will be made by citing a portable information device 110 including the above piezoelectric vibrator 50 as an example of the electronic apparatus. First, the portable information device 110 according to the embodiment is typified by a cellular phone, which is obtained by developing and improving a wrist watch in related art. An appearance of the device is analogous to a wrist watch, and a liquid crystal display is arranged at a portion corresponding to an hour plate to thereby display present time and the like on a screen thereof. When using the device as a communication tool, communication can be performed similarly as a cellular phone in related art, by removing the device from a wrist and using a speaker and a microphone included in an inside portion of a band. However, size and weight of the device has been drastically reduced as compared with the related-art cellular phone.

Subsequently, a configuration of the portable information device 110 according to the embodiment will be explained. The portable information device 110 includes the piezoelectric vibrator 50 and a power supply unit 111 for supplying electric power as shown in FIG. 14. The power supply unit 111 is formed by, for example, a lithium secondary battery. A control unit 112 performing various control, a timer unit 113 performing counting of time and the like, a communication unit 114 performing communication with the outside, a display unit 115 displaying various information and a voltage detection unit 116 detecting voltages of respective function units are connected in parallel to the power supply unit 111. Then, electric power is supplied to respective function units by the power supply unit 111.

The control unit 112 controls respective function units to control operations in the entire system such as transmission/reception of audio data and measurement/display of present time. The control unit 112 also includes a ROM in which programs are previously written, a CPU reading and executing programs written in the ROM, a RAM used as a work area of the CPU and so on.

The timer unit 113 includes an integrated circuit having an oscillating circuit, a register circuit, a counter circuit, an interface circuit and so on, and the piezoelectric vibrator 50. When the voltage is applied to the piezoelectric vibrator 50, the piezoelectric vibrating piece 1 vibrates, and the vibration is converted into an electric signal by piezoelectric characteristics possessed by quartz crystal to be inputted into the oscillating circuit as the electric signal. An output of the oscillating circuit is binarized and counted by the register circuit and the counter circuit. Then, signal transmission/reception is performed with respect to the control unit 112 through the interface circuit, and present time/present date or calendar information and so on are displayed on the display unit 115.

The communication unit 114 has similar functions as the related-art cellular phone, including a radio unit 117, an audio processing unit 118, a switching unit 119, an amplification unit 120, an audio input/output unit 121, a telephone-number input unit 122, a ring-tone generation unit 123 and a call-control memory unit 124.

The radio unit 117 performs transmission/reception of various data such as audio data with respect to base stations through an antenna 125. The audio processing unit 118 encodes and decodes an audio signal inputted from the ratio unit 117 or the amplification unit 120. The amplification unit 120 amplifies a signal inputted from the audio processing unit 118 or the audio input/output unit 121 to a given level. The audio input/output unit 121 is formed by a speaker, a microphone and the like, amplifying a ring tone or receiver audio as well as collecting audio.

The ring-tone generation unit 123 generates the ring tone in accordance with calling from the base station. Only when receiving a call, the switching unit 119 switches the amplification unit 120 connected to the audio processing unit 118 to the ring-tone generation unit 123, the ring tone generated in the ring-tone generation unit 123 is outputted to the audio input/output unit 121 through the amplification unit 120.

The call-control memory unit 124 stores programs concerning incoming/outgoing call control of communication. The telephone-number input unit 122 has, for example, number keys from "0" to "9" and other keys, and a telephone number of a called party and so on is inputted by pressing these number keys.

When the voltage applied to respective function units such as the control unit 112 by the power supply unit 111 becomes lower than a given value, the voltage detection unit 116 detects the voltage decrease and notifies the control unit 112 of the decrease. The given voltage value set at this time is a value previously set as the minimum voltage necessary for stably operating the communication unit 114, which is for example, approximately 3V. The control unit 112 which has received notification of voltage decrease from the voltage detection unit 116 prohibits operations of the radio unit 117, the audio processing unit 118, the switching unit 119 and the ring-tone generation unit 123. Particularly, stop of the operation of the radio unit 117 having large power consumption is fundamental. Moreover, information indicating that the communication unit 114 is unavailable due to the insufficient remaining amount of a battery is displayed on the display unit 115.

That is, it is possible to prohibit the operation of the communication unit 114 and display the prohibition on the display unit 115 by the voltage detection unit 116 and the control unit 112. The display may be made as a message of characters, or it is also preferable that a cross mark is put as a more intuitive display on a telephone icon displayed on an upper part of a display surface of the display unit 115.

It is possible to stop the function of the communication unit 114 more positively by providing a power-off unit 126 which can selectively power off portions concerning the function of the communication unit 114.

As described above, as the portable information device 110 according to the embodiment includes the high-quality piezoelectric vibrator 50 having improved reliability and durability in activation, it is possible to provide the high-quality portable information device 110 having excellent reliability and durability as well as capable of displaying stable and highly-accurate timepiece information for a long period of time.

(Radio Timepiece)

Next, a radio timepiece according to an embodiment of the present invention will be explained with reference to FIG. 15.

Figure 15:
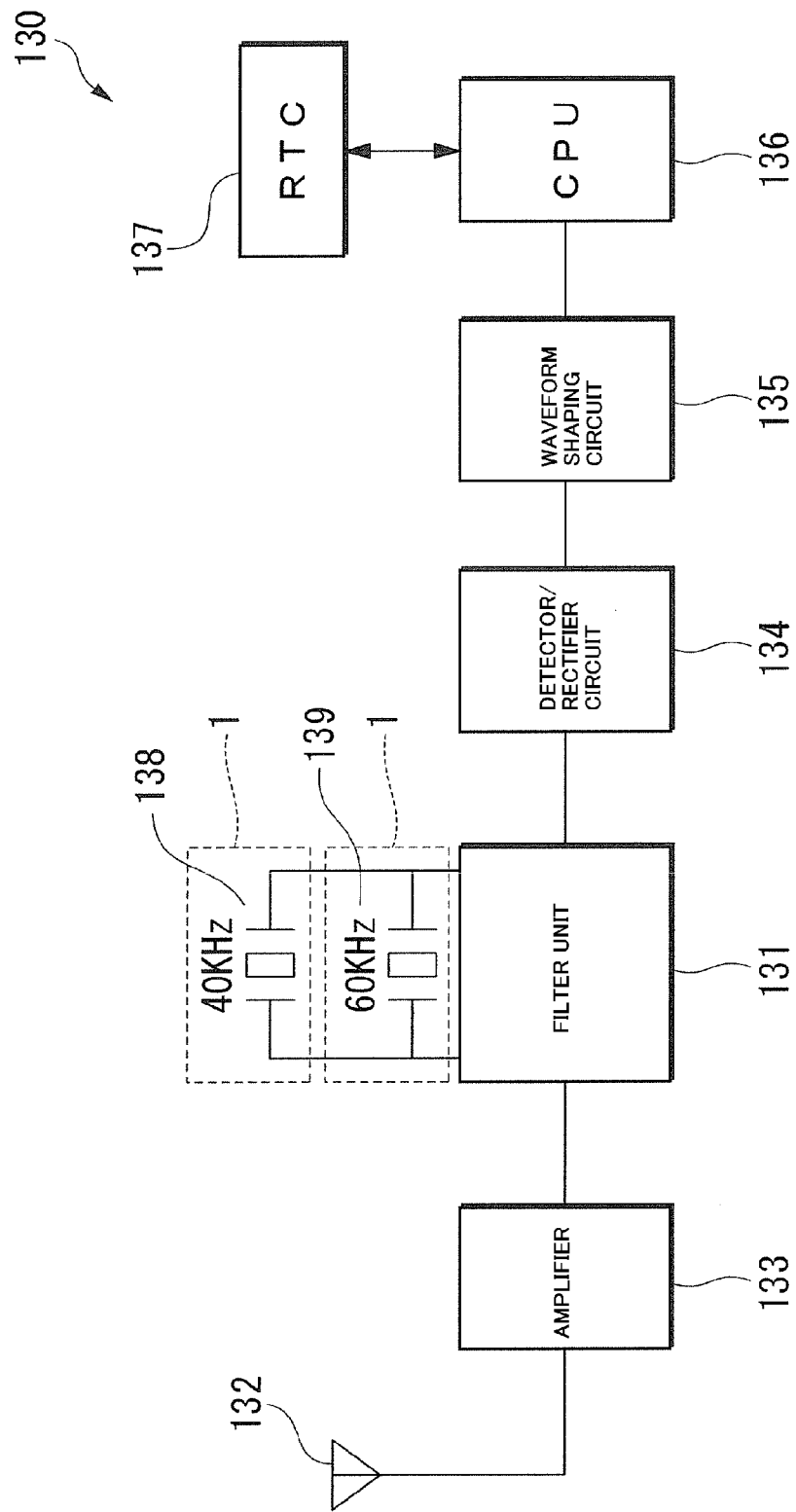
FIG. 15 is a view showing an embodiment of the present invention, which is a structure view of a radio timepiece.

A radio timepiece 130 according to the embodiment includes the piezoelectric vibrator 50 electrically connected to a filter unit 131 as shown in FIG. 15, which is a timepiece having a function of receiving standard radio waves including timepiece information and displaying accurate time after performing automatic correction.

In Japan, there are transmitting stations (transmitter stations), which transmit standard radio waves, in Fukushima prefecture (40 kHz) and Saga prefecture (60 kHz), and respectively transmit standard radio waves. Since long waves such as 40 kHz or 60 kHz have both a property to propagate the ground surface and a property to propagate while being reflected between an ionized layer and the ground surface, therefore, a wide range of propagation is achieved, so that the above-described two transmitting stations cover the entire part of Japan.

Hereinafter, a functional configuration of the radio timepiece 130 will be explained in detail.

An antenna 132 receives a long-wave standard radio wave of 40 kHz or 60 kHz. The long standard radio wave is time information referred to as a time code and subjected to an AM modulation to a carrier wave of 40 kHz or 60 kHz. The received long standard wave is amplified by an amplifier 133 and is filtered and synchronized by the filter unit 131 having plural piezoelectric vibrators 50.

The piezoelectric vibrators 50 according to the embodiment respectively include quartz vibrator units 138 and 139 having resonant frequencies of 40 kHz and 60 kHz which are the same as the above-described carrier frequencies, respectively.

Moreover, the filtered signal having a given frequency is detected and demodulated by a detection/rectification circuit 134.

Subsequently, the time code is acquired through a waveform shaping circuit 135, and counted by a CPU 136. The CPU 136 reads information such as the current year, day of year, day of the week, time of day and the like. The read information is reflected on an RTC 137, and correct time of day information is displayed.

Since the carrier wave has 40 kHz or 60 kHz, vibrators having the above-described turning-fork type structure are suitable for the quarts vibrator units 138 and 139.

The above description is based on an example in Japan, and frequencies of the long standard radio waves are different in foreign countries. For example, in Germany, a standard radio wave of 77.5 kHz is used. Therefore, when the radio timepiece 130 which can be used in the foreign countries is incorporated in a portable apparatus, another piezoelectric vibrator 50 having a frequency different from that in Japan is required.

As described above, the radio timepiece 130 according to the embodiment has the high-quality piezoelectric vibrator 50 having improved reliability and durability in activation, therefore, it is possible to provide the high-quality radio timepiece 130 having excellent reliability and durability as well as capable of counting time stably and highly accurately for a long period of time.

Although the embodiments of the present invention have been described as the above with reference to the drawings, the specific structure is not limited to the above embodiments and includes design modification and so on not departing from the gist of the invention.

For example, the surface-mounted type piezoelectric vibrator 50 has been explained by being cited as an example of the piezoelectric vibrator, however, the present invention is not limited to the piezoelectric vibrator 50. For example, a cylinder-package type piezoelectric vibrator and a surface-mounted type piezoelectric vibrator formed by fixing the cylinder-package type piezoelectric vibrator by being molded by a mold resin portion can be applied.

Also in the above embodiment, the case where the piezoelectric vibrating piece 1 is mounted by bumps made of gold and so on has been explained, however, it is not limited to this, and for example, the piezoelectric vibrating piece 1 may be mounted on a ceramic substrate by using conductive adhesive.

Furthermore, the offset amount of the second groove portion 27 can be appropriately changed in design depending on the etching residue 24. Additionally, the width, length, shape and the like of the first groove portion 26 and the second groove portion 27 can be appropriately changed in design.

Additionally, it is appropriately possible to replace the components according to the above embodiment with well-known components in a scope not departing from the gist of the invention, or above modification examples may be appropriately combined.

(Reference Example)

In the above description, the type in which the first groove portion 26 and the second groove portion 27 are provided has been explained, however, it is not always necessary to provide the second groove portion 27 when the device gives weight to a point of suppressing variation in weight balance in the X axis direction of the vibrating arm portions 10 and 11. In such case, only the first groove portions 26 are provided at the vibrating arm portions 10 and 11, and further, each first groove portion 26 is offset in the −X axis direction with respect to the center line O in each of the vibrating arm portions 10 and 11. According to the above structure, it is possible to reduce variation in weight balance of the vibrating arms 10 and 11 caused by the etching residues of the first groove portions 26.

That is, a tuning-fork type piezoelectric vibrating piece including a pair of vibrating arm portions arranged in parallel to each other, a base portion integrally fixing base end portions of the pair of vibrating arm portions in a length direction, groove portions formed on main surfaces of the pair of vibrating arm portions and extending along the length direction, in which a thickness direction of the vibrating arm portions is a Z axis direction of crystal axes, the length direction of the vibrating arm portions is a Y axis direction of crystal axes and a width direction orthogonal to the length direction and the thickness direction of the vibrating arm portions is an X axis direction of crystal axes, and each of the groove portions is arranged so as to be offset in a −X direction with respect to a center line extending in the length direction of each of the vibrating arm portions.

Similarly, the piezoelectric vibrator, the oscillator, the electric apparatus, the radio timepiece can obtain an accurate output signal having excellent drive level characteristics by applying the piezoelectric vibrating piece.

Additionally, the length of the groove portions is not particularly limited in this case, and it is sufficient that the groove portions extend from the base end portions of the vibrating arms to the vicinity of middle portions of the vibrating arms. The configurations of the piezoelectric vibrator, the oscillator, the electric apparatus, the radio timepiece are as described above.

The offset amount may be determined in view of the amount of etching residues, however, when the offset amount is large, it is difficult to form the excitation electrodes on the main surface on the −X axis direction side on the main surface of the vibrating arm portions, therefore, it is necessary to consider the easiness in forming the excitation electrodes as the upper limit of the offset amount.

What is claimed is:

1. A tuning-fork type piezoelectric vibrating piece comprising:
   a pair of vibrating arms parallel to each other;
   a base portion integrally fixing base ends of the pair of vibrating arms in a length direction; and
   groove portions in main surfaces of the pair of vibrating arms and extending along the length direction,
   wherein a thickness direction of the vibrating arms is aligned with a Z axis direction of a crystal axes, the length direction of the vibrating arms is aligned with a Y axis direction of the crystal axes and a width direction is aligned with an X axis direction of the crystal axes and orthogonal to the length direction and the thickness direction, and
   wherein each of the groove portions includes a first groove portion proximate to a tip end of the vibrating arms and a second groove portion proximate to the base ends of the vibrating arms relative to the first groove portion,
   a centerline in the Y axis direction of the second groove portion is offset along the X axis direction with respect to a centerline in the Y axis direction of the first groove portion, and
   a groove width in the width direction of the second groove portion is narrower than a groove width of the first groove portion.

2. The vibrating piece of claim 1, wherein a groove length in the length direction of the second groove portion is less than a groove length of the first groove portion.

3. The vibrating piece of claim 1, wherein each of the pair of vibrating arms have opposing first and second edge surfaces orthogonal to the main surface, where the first edge surfaces face each other and where the centerline of the second groove portion is proximate to the first edge surface in one vibrating arm and proximate to the second edge surface in the other vibrating arm.

4. The vibrating piece of claim 1, wherein each of the pair of vibrating arms have opposing first and second edge surfaces orthogonal to the main surface, where the first edge surfaces face each other and a width from a proximal side of the second groove portion to the first edge surface along the main surface differs with respect to each of the vibrating arms.

5. The vibrating piece of claim 4, wherein the proximal side of the second groove portion includes a surface extending from the main surface and inclined in the X axis direction toward the centerline of the second groove portion and an opposite side of the second groove portion is substantially orthogonal to the X axis direction.

6. The vibrating piece of claim 1, wherein the first groove portion is separated from the second grove portion along the main surface of each vibrating arm.

7. The vibrating piece of claim 1, wherein the second groove portion is offset in a –X axis direction with respect to the first groove portion in the X axis direction.

8. A piezoelectric vibrator comprising:
   the piezoelectric vibrating piece according to claim 1; and
   a package having a base substrate and a lid substrate bonded to each other, the package housing the piezoelectric vibrating piece in a cavity formed between the base and lid substrates.

9. An oscillator comprising the piezoelectric vibrator according to claim 8 electrically connected to an integrated circuit resonator.

10. An electronic apparatus comprising the piezoelectric vibrator according to claim 8 electrically connected to a timer unit.

11. A radio timepiece comprising the piezoelectric vibrator according to claim 8 electrically connected to a filter unit.

* * * * *